United States Patent
Dar et al.

(10) Patent No.: US 9,834,438 B2
(45) Date of Patent: Dec. 5, 2017

(54) COMPENSATION AND CALIBRATION FOR MEMS DEVICES

(71) Applicants: Tehmoor M. Dar, Mesa, AZ (US); Bruno J. Debeurre, Phoenix, AZ (US); Raimondo P. Sessego, Chandler, AZ (US); Richard A. Deken, Madison, MS (US); Aaron A. Geisberger, Austin, TX (US); Krithivasan Suryanarayanan, Chandler, AZ (US)

(72) Inventors: Tehmoor M. Dar, Mesa, AZ (US); Bruno J. Debeurre, Phoenix, AZ (US); Raimondo P. Sessego, Chandler, AZ (US); Richard A. Deken, Madison, MS (US); Aaron A. Geisberger, Austin, TX (US); Krithivasan Suryanarayanan, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 174 days.

(21) Appl. No.: 14/947,812

(22) Filed: Nov. 20, 2015

(65) Prior Publication Data

US 2016/0167961 A1    Jun. 16, 2016

Related U.S. Application Data

(63) Continuation of application No. 14/161,260, filed on Jan. 22, 2014, now Pat. No. 9,221,679, and a
(Continued)

(51) Int. Cl.
*B81C 99/00* (2010.01)
*G01P 21/00* (2006.01)

(52) U.S. Cl.
CPC ............ *B81C 99/003* (2013.01); *G01P 21/00* (2013.01)

(58) Field of Classification Search
CPC ............................... B81C 99/003; G01P 21/00
See application file for complete search history.

(56) References Cited

U.S. PATENT DOCUMENTS 6,023,961 A   2/2000  Discenzo et al.
6,473,019 B1  10/2002 Ruha et al.
(Continued)

FOREIGN PATENT DOCUMENTS

WO    2013047787 A1    4/2013

OTHER PUBLICATIONS

Mitteregger et al., A 20-mW 640-MHz CMOS Continuous-Time Sigma Delta ADC With 20-MHz Signal Bandwidth, 80-dB Dynamic Range and 12-bit ENOB, pp. 2641-2649, IEEE Journal of Solid-State Circuits, vol. 41, No. 12, Dec. 2006.
(Continued)

*Primary Examiner* — Francis Gray

(57) ABSTRACT

A sensor system includes a microelectromechanical systems (MEMS) sensor, processing circuitry, measurement circuitry, stimulus circuitry and memory. The system is configured to provide an output responsive to physical displacement within the MEMS sensor to the measurement circuitry. The stimulus circuitry is configured to provide a stimulus signal to the MEMS sensor to cause a physical displacement within the MEMS sensor. The measurement circuitry is configured to process the output from the MEMS sensor and provide it to the processing circuitry, which is configured to generate stimulus signals and provide them to the stimulus circuitry for provision to the MEMS sensor. Output from the measurement circuitry corresponding to the physical displacement occurring in the MEMS sensor is monitored and used to calculate MEMS sensor characteristics. Methods for monitoring and calibrating MEMS sensors are also provided.

19 Claims, 10 Drawing Sheets

Related U.S. Application Data continuation-in-part of application No. 13/795,704, filed on Mar. 12, 2013, now Pat. No. 9,335,396.

(56) References Cited

U.S. PATENT DOCUMENTS

| | | | |
|---|---|---|---|
| 6,859,170 | B2 | 2/2005 | Devereux et al. |
| 7,079,068 | B2 | 7/2006 | Clement et al. |
| 7,397,410 | B2 | 7/2008 | Yang |
| 7,420,497 | B2 | 9/2008 | Chiu |
| 7,423,567 | B2 | 9/2008 | Melanson |
| 8,344,796 | B2 | 1/2013 | Onishi |
| 2003/0163287 | A1 | 8/2003 | Vock et al. |
| 2007/0129926 | A1 | 6/2007 | Verheyen et al. |
| 2008/0106608 | A1 | 5/2008 | Clark et al. |
| 2008/0178671 | A1 | 7/2008 | Miller et al. |
| 2009/0003629 | A1 | 1/2009 | Shajaan et al. |
| 2012/0116707 | A1* | 5/2012 | Malvern ............... G01P 15/125 702/104 |
| 2013/0162365 | A1 | 6/2013 | Otaguro et al. |
| 2014/0083164 | A1* | 3/2014 | Homeijer ............... G01V 1/162 73/1.82 |
| 2014/0230551 | A1* | 8/2014 | Kunimi ............... G01P 15/125 73/514.32 |
| 2014/0250970 | A1 | 9/2014 | Fang et al. |
| 2014/0250971 | A1 | 9/2014 | Fang et al. |
| 2014/0266246 | A1* | 9/2014 | Debeurre ............. G01R 35/005 324/601 |

OTHER PUBLICATIONS

Dorrer et al., A 3-mW 74-dB SNR 2-MHz Continuous-Time Delta-Sigma ADC With a Tracking ADC Quantizer in .13 Micron CMOS, pp. 2416-2427, IEEE Journal of Solid-State Circuits, vol. 40, No. 12, Dec. 2005.

Mohammad Ranjbar, A 3.1 mW Continuous-Time Sigma Delta Modulator With 5-Bit Successive Approximation Quantizer for WCDMA, pp. 1479-1491, IEEE Journal of Solid-State Circuits, vol. 45, No. 8, Aug. 2010.

* cited by examiner

COMPENSATION AND CALIBRATION FOR MEMS DEVICES

CROSS-REFERENCE TO RELATED APPLICATIONS

This application is a continuation of U.S. Utility patent application to "COMPENSATION AND CALIBRATION FOR MEMS DEVICES," Ser. No. 14/161,260, filed Jan. 22, 2014, which is a continuation-in-part of U.S. Utility patent application to "MCU-BASED COMPENSATION AND CALIBRATION FOR MEMS DEVICES," Ser. No. 13/795,704, filed Mar. 12, 2013, and assigned to the assignee hereof, which is incorporated by reference in its entirety herein.

TECHNICAL FIELD OF THE INVENTION

The present invention relates generally to microelectromechanical systems (MEMS) devices utilized in electronic systems. More specifically, the present invention relates to electronically testing, measuring and calibrating MEMS devices.

BACKGROUND OF THE INVENTION

Microelectromechanical Systems (MEMS) sensors are widely used in applications such as automotive, inertial guidance systems, household appliances, protection systems for a variety of devices, and many other industrial, scientific, and engineering systems. Such MEMS sensors are used to sense a physical condition such as acceleration, pressure, angular rotation, or temperature, and to provide an electrical signal representative of the sensed physical condition to the applications and/or systems employing the MEMS sensors.

BRIEF DESCRIPTION OF THE DRAWINGS

A more complete understanding of the present invention may be derived by referring to the detailed description and claims when considered in connection with the Figures (not necessarily drawn to scale), wherein like reference numbers refer to similar items throughout the Figures, and:

DETAILED DESCRIPTION

Figure 1:
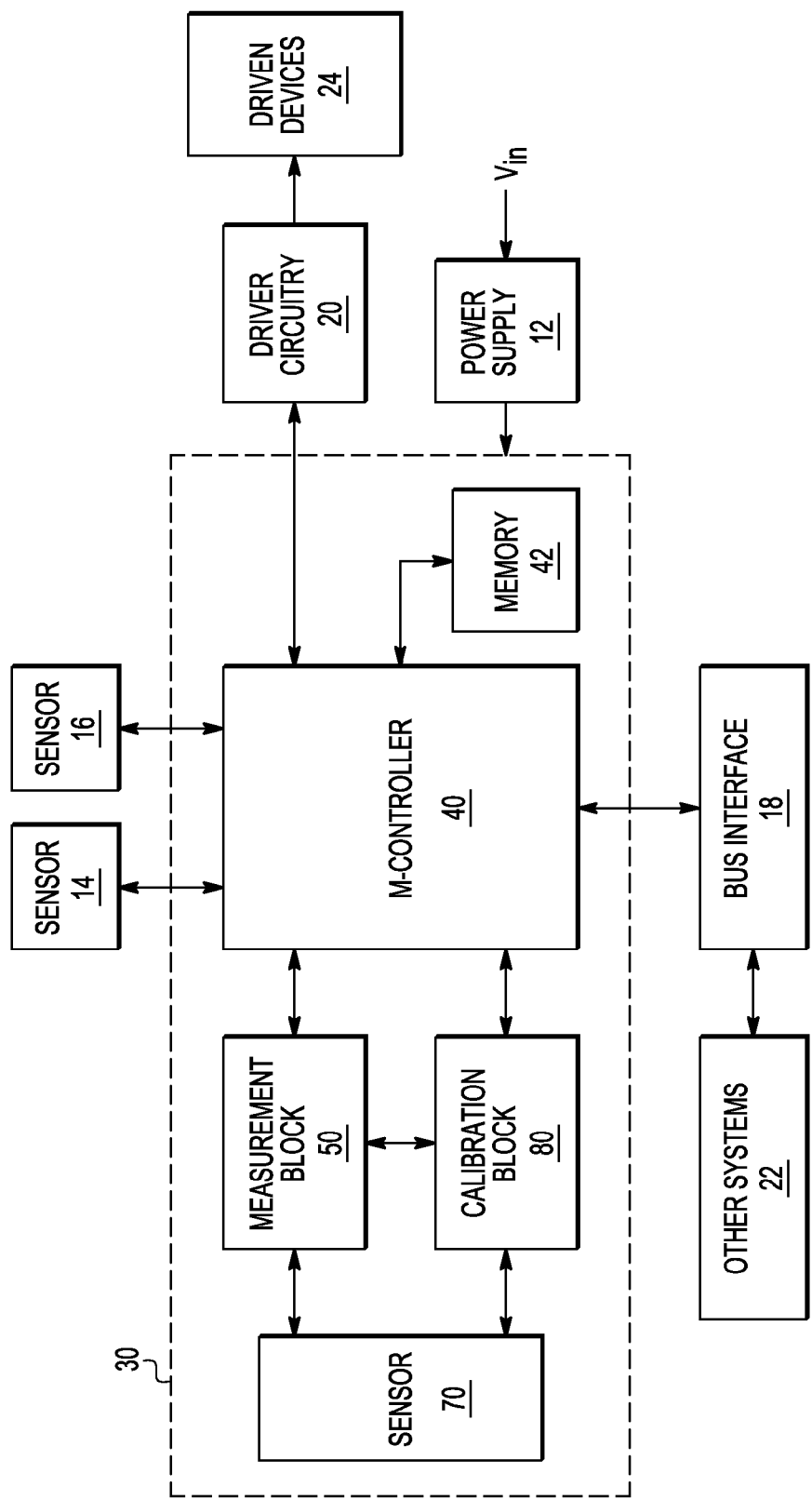
FIG. 1 shows a block diagram of a sensor-responsive system configured in accordance with the teaching of an embodiment.

Capacitive-sensing MEMS designs are highly desirable for operation in acceleration, angular rotation, pressure environments and in miniaturized devices due to their relatively low cost. When subjected to acceleration, angular rotation, pressure, or some other external stimulus to which the MEMS device is designed to be responsive, capacitive sensing MEMS devices provide a change in electrical capacitance that corresponds to the magnitude of the applied stimulus. In other words, the electrical output at a given time of a MEMS device corresponds to the magnitude of the stimulus applied to that MEMS device at that given time. In this manner, by monitoring the electrical output of a MEMS device, a system may determine the magnitude of external stimuli applies to various MEMS devices (pressure, acceleration, etc.), and use that information to help determine what actions the system should take responsive to the stimuli. For example, an automotive air bag system sensing a rapid deceleration of the automobile based on the electrical output of a MEMS accelerometer device may determine that it is necessary to deploy an airbag in order to protect a vehicle occupant. One common form of MEMS device is an accelerometer in the form of a two layer capacitive transducer having a "teeter-totter" or "see saw" configuration. This commonly utilized transducer type uses a movable element or plate that rotates under z-axis acceleration above a substrate. The accelerometer structure can measure two distinct capacitances to determine differential or relative capacitance, and provide that information as an output to the MEMS accelerometer. Other MEMS devices designed to sense other applied stimuli may take on various forms, provided that the output of the MEMS device is configured to correspond to the magnitude of the stimulus being monitored.

The electro-mechanical characteristics of each MEMS device may differ due to a variety of factors (manufacturing tolerances, slight differences in processing depending on where and when the MEMS device was manufactured, etc.). This means that the electrical output of one MEMS device responsive to a certain magnitude of stimulus might be different from the electrical output of a second MEMS device responsive to a stimulus of the very same magnitude. Because systems employing MEMS devices may use the electrical output to calculate the extent of the stimulus, and may use the result of that calculation to determine whether or not to take a certain action (such as, for example, deploying an airbag), it is important that MEMS devices be calibrated such that a system can correlate a given electrical output from the MEMS sensor to a specific amount of applied stimulus. Typically this calibration occurs prior to shipment of the system employing the MEMS sensor, and is accomplished by applying the actual physical stimulus (for example, acceleration) to the system, measuring the electrical response of the MEMS sensor, and storing values in the system representative of any "correction" factors that need to be applied to the electrical output of the MEMS sensor to make sure that the "corrected" MEMS sensor output corresponds to the magnitude of the applied stimulus.

Although physically applying various stimuli to systems employing MEMS sensors can serve to provide calibration data such that the system can function properly, such physical testing can be expensive, time-consuming and damaging to the system being tested. Furthermore, the need to physically test a variety of systems and applications employing MEMS sensors can require numerous, application-specific test stations to be designed and built for each application to be tested, increasing the cost and time associated with such testing. In addition, although physical testing prior to shipment of systems employing MEMS sensors can provide calibration data that may be accurate at the time of testing, such testing ignores the fact that over time (and as a result of use and/or damage), the electro-mechanical characteristics of the MEMS device may change, making the initial calibration values no longer appropriate, and possibly causing system malfunction. Finally, in the event of a system malfunction, attempts to determine the cause of the malfunction can be complicated by requiring that the system employing the MEMS device be physically removed from the end application (such as, for example, an automobile) so that the MEMS device can again be physically tested and possibly recalibrated. Such a requirement can make maintenance and repair of systems employing MEMS devices cost-prohibitive.

In addition to the previously discussed limitations of physical testing previously discussed, it can be beneficial to provide for real time (rather than delayed) compensation and calibration of MEMS devices during their use in an application, providing for more accurate results based on MEMS data, and providing for earlier indications of error conditions of MEMS device anomalies.

It may also be beneficial, depending on the type of MEMS sensor being tested, to allow for the testing of multiple parameters, and the gathering of large amounts of data for each parameter to allow for more accurate calibration. More specifically, some MEMS sensors have a variety of parameters that should be calibrated in order to allow for accurate operation of the MEMs sensor. Due to memory size and board space limitations, and the costs associated with the memory itself, and board space required to place the memory, it would be advantageous to provide for testing systems and methods that would allow for real-time calibration of MEMS sensors without the need to store sensor data used to calibrate the MEMs sensor in memory. Finally, it may be advantageous from an application cost, power consumption and board size perspective in certain applications involving MEMS sensors, to provide for MEMS sensor calibration systems and methods that provide for the use of state machines rather than microcontrollers and processors.

In one aspect, a system and method are provided for the electrical testing of MEMS devices without a need for applying physical forces external to the MEMS device. In an additional aspect, a system and method are provided for testing, monitoring and recalibrating MEMS devices throughout the lifetime of those MEMS devices and while those devices remain located and functioning in systems employing the MEMS devices. In yet another aspect, systems and methods are provided for testing and recalibrating MEMS devices in real-time, without the need to store intermediate data used to calibrate the MEMS devices in memory. Finally, in yet another aspect, systems and methods are provided for testing and recalibrating MEMS devices utilizing state machines rather than processors or microcontrollers. Thus, systems and methods achieving design objectives of low-cost MEMS sensor testing, repeated testing of MEMS sensors throughout the life of the MEMS sensors, testing of MEMS sensors without removal of the sensors from the application, and re-calibration of MEMS devices during the life of the MEMS devices are provided.

FIG. 1 shows a block diagram of a sensor-responsive system 10 configured in accordance with an embodiment. Sensor-responsive system 10 includes a sensor system 30 configured to monitor, communicate with, calibrate, and control at least one MEMS sensor 70. In an embodiment, MEMS sensor 70 is a MEMS sensor configured to respond to a stimulus by providing an output signal corresponding to the stimulus. Sensor system 30 is also configured to provide sensor-related information from MEMS sensor 70 to other elements of sensor-responsive system 10. Sensor system 30 is further configured to process sensor-related information from MEMS sensor 70, perform calculations and make decisions based on the sensor-related information, communicate the results of the calculations and decisions to other components of sensor-responsive system 10, and to cause other components of sensor-responsive system 10 to perform actions based on the results of the calculations and decisions. A more specific discussion of sensor system 30 will be discussed below with respect to FIG. 2.

Continuing with FIG. 1, sensor-responsive system 10 includes a bus interface 18 coupled to sensor system 30 and to other systems 22. Bus interface 18 is configured to communicate data and commands between sensor system 30 and various other systems 22 that may also be connected to bus interface 18. In an embodiment in which sensor-responsive system 10 is located in an automobile, bus interface 18 may be any number of automotive-related busses such as CAN or J-1850. In other embodiments, bus interface 18 may be any other bus configured to allow the communication of data and/or commands among devices electrically coupled to bus interface 18. Other systems 22 may be systems configured to provide input data to sensor system 30 or receive output from sensor system 30. In an embodiment in which sensor-responsive system 10 is located in an automobile, other systems 22 may include engine control modules, body electronics control modules, transmission control modules, or any other vehicle electronics module. In other embodiments in which sensor-responsive system 10 is being used in conjunction with inertial guidance systems, household appliances, protection systems for a variety of devices, portable computing and telecommunication devices, handheld game controllers, and other industrial, scientific, and engineering systems, other systems 22 may include modules and/or components of those systems.

Sensor-responsive system 10 is also shown including sensor 14 and sensor 16. In an embodiment, sensor 14 is an occupant sensor configured to determine if an occupant is present in an automobile, and to provide a signal indicative of an occupant being present to sensor system 30. In an embodiment, sensor 16 is a rollover sensor configured to determine if an automobile in which it is located has rolled over, and to provide a signal indicative of a rollover condition to sensor system 30.

Sensor-responsive system 10 is further shown having driver circuitry 20 electrically coupled to sensor system 30 and driven devices 24. Driver circuitry 20 is configured to provide a signal, responsive to a signal from sensor system 30, to driven devices 24 to cause driven devices 24 to take some action. In an embodiment in which sensor-responsive system 10 is an airbag system located in an automobile, driven devices 24 are squibs coupled to airbags, and driver circuitry 20 is configured to provide an electronic signal to the driven devices 24 (squibs), responsive to an electronic signal provided by sensor system 30, to cause the squibs to deploy airbags in the vehicle.

Sensor-responsive system 10 is further shown having a power supply 12. Power supply 12 is electronically coupled to sensor system 30 and other components of sensor-responsive system 10, and is configured to provide sensor system 30 and other components of sensor-responsive system 10 with various voltages and currents to permit the sensor-responsive system 10 and its components to operate. It should be appreciated that power supply 12 may be configured to supply any number of voltages and currents, from low voltages required to supply digital signal levels, to high voltage levels to drive various power and electro-mechanical devices.

Figure 2:
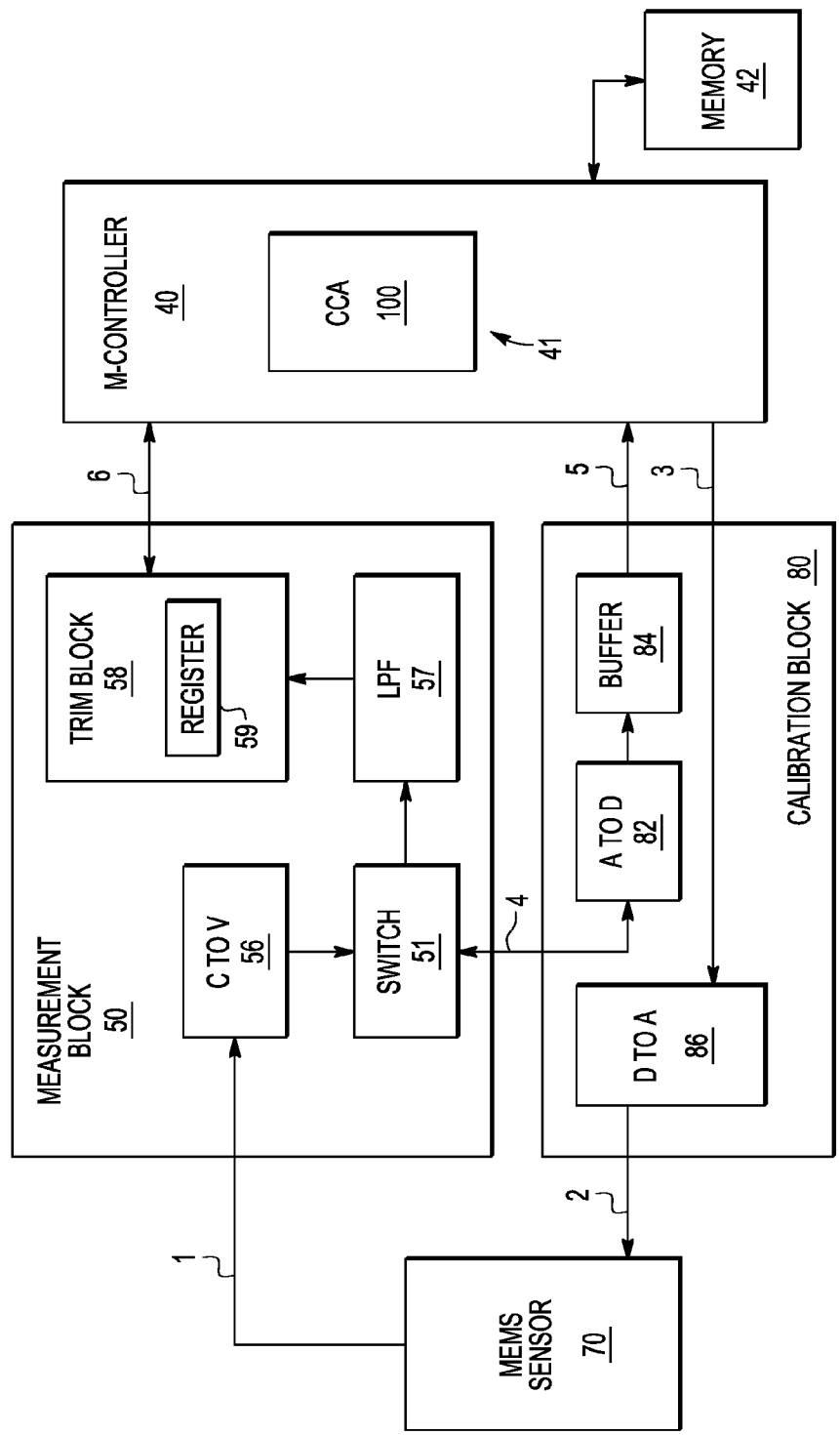
FIG. 2 shows a block diagram of a sensor system of the sensor-responsive sys em of FIG. 1 configured in accordance with the teaching of an embodiment.

FIG. 2 shows a block diagram of a sensor system 30 of the sensor-responsive system of FIG. 1 configured in accordance with an embodiment. Sensor system 30 includes a MEMS sensor 70. MEMS sensor 70 is an electromechanical sensor configured with at least one moveable mechanical portion. The moveable mechanical portion has a pre-determined range of travel, and an electrical signal 1 provided external to MEMS sensor 70 varies according to the movement of the moveable mechanical portion within the range of travel. In an embodiment, MEMS sensor 70 is configured such that, when the moveable mechanical portion of MEMS sensor 70 moves, it continuously provides capacitance values at an output of MEMS sensor 70 that correspond to the magnitude of the motion of the moveable mechanical portion.

In addition, MEMS sensor 70 is configured to receive at least one input signal 2, such that when the input signal 2 is provided to the input of MEMS sensor 70, the moveable mechanical portion of MEMS sensor 70 moves, responsive to the input signal 2, an amount corresponding to the magnitude of the input signal 2. In an embodiment, MEMS sensor 70 is configured such that when an analog voltage is applied to an input of MEMS sensor 70, the moveable mechanical portion of MEMS sensor 70 moves an amount that corresponds to the magnitude of the analog voltage, and continues to move corresponding to any voltage changes in the input signal 2. In an embodiment, MEMS sensor 70 is configured such that when the moveable mechanical portion of MEMS sensor 70 moves, an analog voltage corresponding to movements of the moveable mechanical portion may be provided at an output of MEMS sensor 70. In an alternative embodiment, MEMS sensor 70 is configured such that when the moveable mechanical portion of MEMS sensor 70 moves a signal other than voltage or capacitance corresponding to the movements of the moveable mechanical portion may be provided at an output of MEMS sensor 70. In an embodiment, MEMS sensor 70 is a MEMS accelerometer, providing an output signal 1 corresponding to movement of the moveable mechanical portion in response to acceleration or deceleration of MEMS sensor 70, or a device in which MEMS sensor 70 is present.

In alternative embodiments, MEMS sensor 70 may be any MEMS sensor configured as, for example, an inertial sensor, gyroscope, pressure sensor, or any other MEMS device configured to provide an output signal in response to a physical stimulus. It should be appreciated that each MEMS device may have a number of characteristics unique to each individual MEMS device, such as, for example, a resonant frequency, damping characteristics, displacement characteristics, spring constant characteristics, thickness, space between beams, and other response characteristics. It should also be appreciated that these unique characteristics may change over time, and/or in response to physical forces applied to the MEMS device or environmental conditions such as temperature. MEMS sensor 70 may be formed using existing and upcoming MEMS fabrication design rules and processes that include, for example, deposition, patterning, and etching.

Sensor system 30 further includes a measurement block 50 electrically coupled to MEMS sensor 70. Measurement block 50 is configured to receive an electronic signal 1 from MEMS sensor 70, process the signal 1 to convert it to a form useable by devices external to measurement block 50, filter the signal 1, and provide the processed, and in some cases filtered, signal 1 to devices coupled to measurement block 50, such as, for example, microcontroller 40 and calibration block 80 (discussed infra). In an embodiment generally illustrated in FIG. 2, sensor system 30 includes capacitance-to-voltage (C-to-V) circuitry referred to herein as C-to-V 56. C-to-V 56 is configured to receive an input capacitance from MEMS sensor 70 and convert it to a voltage output.

The voltage output of C-to-V 56 is shown coupled to a switch 51. Switch 51 is configured to switch between providing the output voltage of C-to-V 56 to a calibration block 80 (described infra), and providing the output voltage of C-to-V 56 to a low pass filter 57. Low pass filter 57 is shown electrically coupled to a trim block 58. Low pass filter 57 is configured to low-pass filter the output voltage received from C-to-V 56 via switch 51 to remove noise, and provide the filtered output voltage to trim block 58. Trim block 58 is shown including registers 59. Registers 59 are configured to store calibration values (also referred to as trim values) used in monitoring, evaluating, calibrating, and operating MEMS sensor 70. Trim block 58 is also shown electrically coupled to microcontroller 40 (discussed infra). In an embodiment, calibration/trim values are constants that are used in calculations performed by microcontroller 40 to more directly correlate the output of MEMS sensor 70 with the actual physical motion of the moveable mechanical portions of the MEMS sensor 70. Trim block 58 is configured to provide the filtered output voltage provided by C-to-V 56 to microcontroller 40 as a signal 6, to receive and store trim values calculated by microcontroller 40 in registers 59, and to provide those stored trim values to microcontroller 40 for use in various algorithms running in microcontroller 40.

In an alternative embodiment, LPF 57 may be bypassed, and an unfiltered output voltage provided to microcontroller 40 for use by microcontroller 40 in estimating trim values/coefficients. In an embodiment, trim values, such as offset and gain trim values of MEMS sensor 70, are analog, and registers 59 are configured to store the analog trim values. In an embodiment, initial trim values, comprising electrical characteristics of trim block 58 such as oscillator trim, regulator voltage trim, reference current trim, capacitance characteristics of trim block 58, and other electrical characteristics of trim block 58, are determined and stored in registers 59 based on factory testing and calculations prior to sensor system 30 being placed into service in an application. These initial trim values may be used by microcontroller 40 in various algorithms unless and until the trim values are updated. It should be appreciated that the initial trim values for trim block 58 may be based on manufacturing process data, calculations or estimates provided by engineering teams based on process and other data, or other testing done at the factory during manufacturing of sensor system 30.

In an embodiment, measurement block 50 receives a low-level capacitance signal from MEMS sensor 70, converts the signal to a voltage signal using capacitance-to-voltage (C-to-V) circuitry 56 of measurement block 50, provides the voltage signal to calibration block 80 as a signal 4, filters the voltage signal using low-pass filter circuitry of MEMS sensor 70, and provides the filtered voltage signal to microcontroller 40 as a signal 5. In an embodiment, measurement block 50 further provides switch 51 to switch between providing the voltage signal 4 to calibration block 80 on the one hand, and providing the voltage signal 4 to the low pass filter (and subsequently to microcontroller 40). As noted above, the electronic signal provided to measurement block 50 by MEMS sensor 70 will have characteristics corresponding to the movement of the moveable mechanical portion of MEMS sensor 70. In addition, the resulting voltage signal provided by measurement block 50 will also have characteristics corresponding to the movement of the moveable mechanical portion of MEMS sensor 70. In effect, the resulting voltage signal 4 provides a picture of how the moveable mechanical portion of MEMS sensor 70 is moving.

Sensor system 30 also includes a calibration block 80 electrically coupled to measurement block 50, MEMS sensor 70, and microcontroller 40. Calibration block 80 is shown having analog-to-digital (A-to-D) conversion circuitry A-to-D 82, A-to-D 82 is configured to receive a voltage signal 4 from C-to-V 56 of measurement block 50, convert the received analog voltage signal to a digital signal representative of the analog voltage signal, and provide the digital voltage signal as a digital voltage signal output from A-to-D 82. A-to-D 82 is shown electrically coupled to a buffer 84. Buffer 84 is configured to store the digital voltage signal provided by A-to-D 82, and to provide the digital voltage signal to microcontroller 40 as signal 5 such that microcontroller 40 may use the signal 5 to monitor the operation of MEMS sensor 70 and perform various algorithms utilizing the digital voltage signal. Calibration block 80 is also shown being configured to provide electrostatic stimulus to MEMS sensor 70. More specifically, in an embodiment, calibration block 80 is shown having digital-to-analog (D-to-A) conversion circuitry D-to-A 86. D-to-A 86 is configured to receive a digital signal 3 from microcontroller 40, convert the received digital signal 3 to an analog signal representative of the received digital signal, and provide the analog signal as an output signal 2 from D-to-A 86. As shown, calibration block 80 is electrically coupled to MEMS sensor 70, and is configured to provide the analog output signal 2 of D-to-A 86 as an input to MEMS sensor 70.

Sensor system 30 also includes a microcontroller 40 electrically coupled to various other components of sensor system 30 and sensor-responsive system 10. In an alternative embodiment, microcontroller may be any type of processor. Microcontroller 40 includes logic, volatile and non-volatile memory 41, registers, input/output circuitry and code configured to cause microcontroller 40 to perform various functions for sensor system 30 and sensor-responsive system 10. As shown in FIG. 2, microcontroller 40 is electrically coupled to measurement block 50, calibration block 80, and memory 42. Microcontroller 40 includes a Calibration and Compensation Algorithm 100 stored in memory 41. Microcontroller 40 is configured, responsive to Calibration and Compensation Algorithm 100, to monitor the operation of MEMS sensor 70, provide input signals, including signal 3, to calibration block 80 to cause calibration block 80 to initiate motion of the mechanical portion of MEMS sensor 70 responsive to the signals, and monitor the output signal of MEMS sensor 70 via measurement block 50. Microcontroller 40 is further configured to evaluate the motion of MEMS sensor 70 responsive to the signals 3, perform calculations using the input and output signals and sensor parameters, determine, based on the calculations, if the MEMS sensor 70 is operating properly and/or if adjustments need to be made in trim values stored in measurement block 50, and provide updated trim values to measurement block 50.

Sensor system 30 also includes memory 42 electrically coupled to microcontroller 40. In an embodiment, memory 42 is non-volatile random access memory (NVRAM) configured to hold values to be used by sensor system 30 in performing calculations related to the calibration and/or measurement of MEMS sensor 70. In an embodiment, values related to MEMS sensor 70, referred to as sensor parameters, are pre-determined at the time of manufacture of sensor system 30, and are stored in memory 42 when sensor system 30 is manufactured. In alternative embodiments, memory 42 may be other types of memory, such as volatile memory, read only memory (ROM), or any other type of memory generally known in the art.

Referring to FIGS. 1 and 2, the operation of sensor-responsive system 10, according to an embodiment of the invention in which the operation of MEMS sensor 70 is being evaluated and calibration is being performed (if necessary), is generally described. Responsive to Calibration and Compensation Algorithm 100, microcontroller 40 causes a digital signal pattern 3 to be provided to D-to-A 86 of calibration block 80. In an embodiment, the digital signal is a pseudo-random signal. In alternative embodiments, the digital signal may be a square wave, a two-tone pattern, multi-tone signal or other signal pattern. D-to-A. 86 converts the digital signal into an analog signal, and provides it as an analog input signal 2 to an input of MEMS sensor 70. The analog input signal 2 creates an electromagnetic force that pulls the moveable mechanical portion (for example, a metallic plate) up and/or down, thereby causing the moveable mechanical portion of MEMS sensor 70 to move responsive to the analog signal. In an embodiment, the analog input signal 2 is applied to fixed capacitance plates of the MEMS sensor 70 located near a moveable mechanical portion, causing the moveable mechanical portion to move. The movement of the moveable mechanical portion of MEMS sensor 70 causes a capacitance value provided at an output of MEMS sensor 70 to vary in a manner that corresponds to the magnitude of the movement of the moveable mechanical portion of MEMS sensor 70. C-to-V 56 of measurement block 50 receives the signal 1 indicative of the varying capacitance value and converts the capacitance values into voltage values. Responsive to Calibration and Compensation Algorithm 100, microcontroller 40 causes switch 51 to switch to a position such that the voltage values provided by C-to-V 56 are provided as an input signal 4 to A-to-D 82 of calibration block 80. A-to-D 82 of calibration block 80 converts the voltage values into digital values, and provides the resulting digital values to microcontroller 40 as signal 5.

Responsive to Calibration and Compensation Algorithm 100, microcontroller 40 evaluates the digital values received from C-to-V 56 via A-to-D 82, evaluates the input signal values initially provided by microcontroller 40, and determines, based on calculations, various parameters of MEMS sensor 70. In an embodiment, microcontroller 40 may use the digital values received to determine various characteristics of MEMS sensor 70, such as, for example, frequency response, damping, spring constant, thickness of MEMS sensor 70, space between beams and/or capacitors on MEMS sensor 70, and other characteristics. In an alternative embodiment, Calibration and Compensation Algorithm 100 in microcontroller 40 first evaluates the input signal values received from calibration block 80 to calculate and/or estimate various parameters such as, for example, the etching bias thickness of the silicon of MEMS sensor 70, side slope of the MEMS sensor 70, critical dimension (CD) of MEWS sensor 70, and fringe of MEMS sensor 70. Calibration and Compensation Algorithm 100 then uses these parameters to calculate estimates of the mass, spring constant, and other properties of the MEMS sensor 70. Finally, Calibration and Compensation Algorithm 100 uses these properties to calculate updated trim values for the MEMS sensor 70, if necessary, which are stored in registers 59 of trim block 58.

In an embodiment, in determining the nature and magnitude of stimulus applied to a MEMS sensor 70, Calibration and Compensation Algorithm 100 utilizes the fact that a MEMS sensor 70, when subjected to a stimulus (such as, for example, acceleration), provides an output signal (such as, for example, a capacitance value) that corresponds both to the motion of a moveable mechanical portion of the MEMS sensor 70, and to the corresponding stimulus (such as, for example, acceleration) to which the MEMS sensor 70 is subjected to cause the motion. Calibration and Compensation Algorithm 100 determines characteristics of the applied stimulus (for example, acceleration) by processing the output signal in conjunction with "trim" or "calibration" values that correspond to various electromechanical characteristics of the MEMS sensor 70 and how that MEMS sensor 70 responds to various a stimulus. These characteristics (trim values) may effect how the MEMS sensor 70 responds to various stimuli (such as, for example, acceleration), and may include, the mass and/or inertia of a moveable portion of the MEMS sensor 70, or other electromechanical characteristics of the MEMS sensor 70.

In determining whether or not to update trim values or take other action, Calibration and Compensation Algorithm 100 may use original trim values for MEMS sensor 70 provided at or near the time of manufacture of MEMS sensor 70. Trim values are based on electromechanical properties of specific MEMS sensor 70, which may vary from device to device, and some of which may change from their original values over time and in certain conditions. For example, the mass and/or inertia of a moveable portion of a MEMS sensor 70 may vary from sensor to sensor due to manufacturing process variations, may change over time with use of the MEMS sensor 70, and may impact the relationship between the MEMS sensor 70 output signal and the physical motion of the moveable portion of the MEMS sensor 70 in response to a stimulus. When a specific MEMS sensor 70 is manufactured, original trim values may be calculated for the device that correspond to the mass of the movable portion of that specific sensor and other electromechanical characteristics of the device. These original values may be stored, for example, in registers 59 of trim block 58. However, as noted above, these trim values may become inaccurate over time due to changes in the electromechanical characteristics of the MEMS sensor 70.

By applying a known stimulus signal to the MEMS sensor 70, the moveable mechanical portion of MEMS sensor 70 may be caused to move in a predictable pattern, Calibration and Compensation Algorithm 100 may then evaluate the output signal of the MEMS sensor 70 (which correlates to how the moveable mechanical portion of MEMS sensor 70 has moved), to determine the mass and/or other electromechanical properties of the MEMS sensor 70, and to calculate trim values corresponding to those electromechanical properties. For example, the mass of the moveable portion of the MEMS sensor 70 may be determined by a specific algorithm using the characteristics of the known stimulus signal and the output signal of the MEMS sensor 70. In an embodiment, this algorithm for a MEMS sensor 70 may be defined from an electrical-mechanical physical model and/or statistical model established and verified by a representative data set of measurements of various MEMS sensor devices.

Calibration and Compensation Algorithm 100 may compare the calculated physical properties, electromechanical properties, and/or trim values to the original properties and/or values or previous properties and/or values. If the properties and/or values are found to have changed, or are inaccurate, new values may be used to replace the original/old values in order to keep the MEMS sensor 70 properly calibrated and/or trimmed. By using updated trim values, an accurate determination of the characteristics of various stimuli applied to the MEMS sensor 70 may continue to be made in spite of changes to the physical and/or electromechanical characteristics of the device over time. Examples of other MEMS sensor electromechanical characteristics for which trim values may be provided include the gaps between capacitance plates of the MEMS sensor, the stiffness of springs in the moveable portion, and any other electromechanical characteristic of the MEMS sensor.

In summary, Calibration and Compensation Algorithm 100 is able to calculate updated trim values for the MEMS sensor 70 by evaluating how the digital values received from C-to-V 56 (and indicative of the response of MEMS sensor 70 to the input stimulus signal) deviate from the expected response of MEMS sensor 70 to the input signal. If microcontroller 40, responsive to Calibration and Compensation Algorithm 100 and various characteristics of MEMS sensor 70, determines that trim values associated with MEMS sensor 70 need to be changed, microcontroller 40 causes updated trim values to be written to registers 59 of trim block 58 of measurement block 50.

Continuing to refer to FIGS. 1 and 2, the operation of sensor-responsive system 10, according to an embodiment of the invention in which calibration is not being performed, is generally described. Microcontroller 40 provides a signal to switch 51, responsive to an algorithm running in microcontroller 40, to switch to a position in which C-to-V 56 provides its output voltage signal 4 to a low pass filter 57. It should be appreciated that when calibration is not being performed, the movable mechanical portions of MEMS sensor 70 will be moving responsive to physical forces (stimulus) to which the sensor system 30 is being subjected. In this case, the capacitive output of MEMS sensor 70 will correspond to the motion of the moveable mechanical portions of MEMS sensor 70 responsive to the physical stimulus. C-to-V 56 of measurement block 50 receives this capacitive output of MEMS sensor 70, converts it to a voltage, and provides the voltage signal 4 to tow pass filter 57. Low pass filter 57 low-pass filters the voltage signal to remove noise, and provides the filtered voltage to trim block 58. Trim block 58 in turn adjusts the voltage signal based on trim values stored in register 59 or trim block 58, and provides the filtered voltage to microcontroller 40 as signal 6. Responsive to an application algorithm running in microcontroller 40, microcontroller 40 evaluates the adjusted, filtered voltage signal, and determines, based on the adjusted, filtered voltage signal, how much the moveable mechanical portion of MEMS sensor 70 has moved. If the moveable mechanical portion of MEMS sensor 70 has moved beyond a predetermined amount, or has moved in a predetermined pattern, microcontroller 40 is configured to cause some action to be taken.

Figure 3:
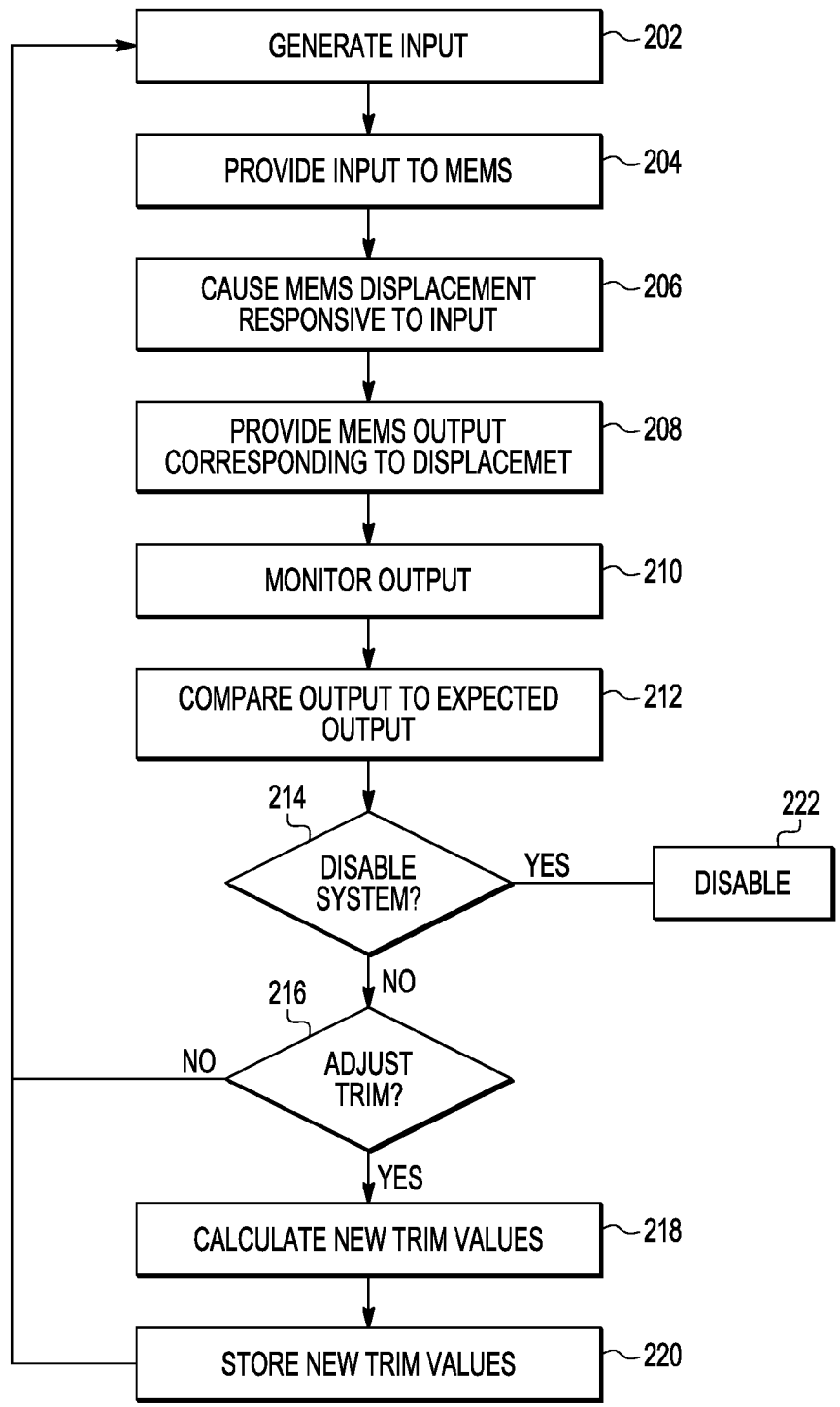
FIG. 3 shows a flow chart of a sensor monitoring and calibration method, according to an embodiment.

FIG. 3 shows a flow chart of a sensor monitoring and calibration method 200, according to an embodiment. In an embodiment, the method 200 is implemented by the execution of Calibration and Compensation Algorithm 100. In a first operation 202, an input signal 3 is generated by a microcontroller 40 (FIG. 1). The signal may be a single value, such as a single voltage level, or it may be a signal pattern including multiple values over time. In a second operation 204, the input signal is provided by microcontroller 40 to a MEMS sensor 70 (FIG. 1) as a signal 2. In a third operation 206, a physical displacement is caused in the MEMS sensor 70 responsive to the input signal 2. In a fourth operation 208, an output signal 1 is provided from the MEMS sensor 70 corresponding to the physical displacement in the MEMS sensor 70 responsive to the input signal 2. In a fifth operation 210, the output is monitored external to the MEMS sensor 70 in microcontroller 40. In a sixth operation 212, microcontroller 40 compares the output from MEMS sensor 70 (signals 5 and/or 6) responsive to the input signal 2 with the expected output of MEMS sensor 70 responsive to the input signal 2.

In a seventh operation 214, microcontroller 40 makes a determination, based on the results of the comparison of operation 212, as to whether or not sensor system 30 (FIG. 2) and/or sensor-responsive system 10 (FIG. 1) should be disabled, if sensor system 30 and/or sensor-responsive system 10 are to be disabled, they are disabled in operation 222. If sensor system 30 and/or sensor-responsive system 10 are not to be disabled, processing continues with an eighth operation 216. In eighth operation 216, microcontroller 40 makes a determination, based on the result of the comparison of operation 212, as to whether or not trim values for MEMS sensor 70 need to be adjusted. If new trim values are not needed processing returns to operation 202. If new trim values are needed, processing continues with a ninth operation 218, in which new trim values are calculated using the output signals 5 provided by MEMS sensor 70. In a tenth operation 220, the newly calculated trim values are stored into a measurement block 50 (FIG. 2), and processing then returns to the first operation 202.

In an alternative embodiment (not shown), all of the components generally illustrated in FIG. 2 may be formed together on a single substrate and provided as a unitary device. In yet another alternative embodiment (not shown), all of the components generally illustrated in FIG. 2 may be coupled together in a single module. In yet another alternative embodiment, in addition to providing the ability to disable systems in which MEMS devices cannot be re-calibrated or are no longer functional, the ability to notify users of systems employing MEMS devices of problems with the MEMS devices is provided.

Figure 4:
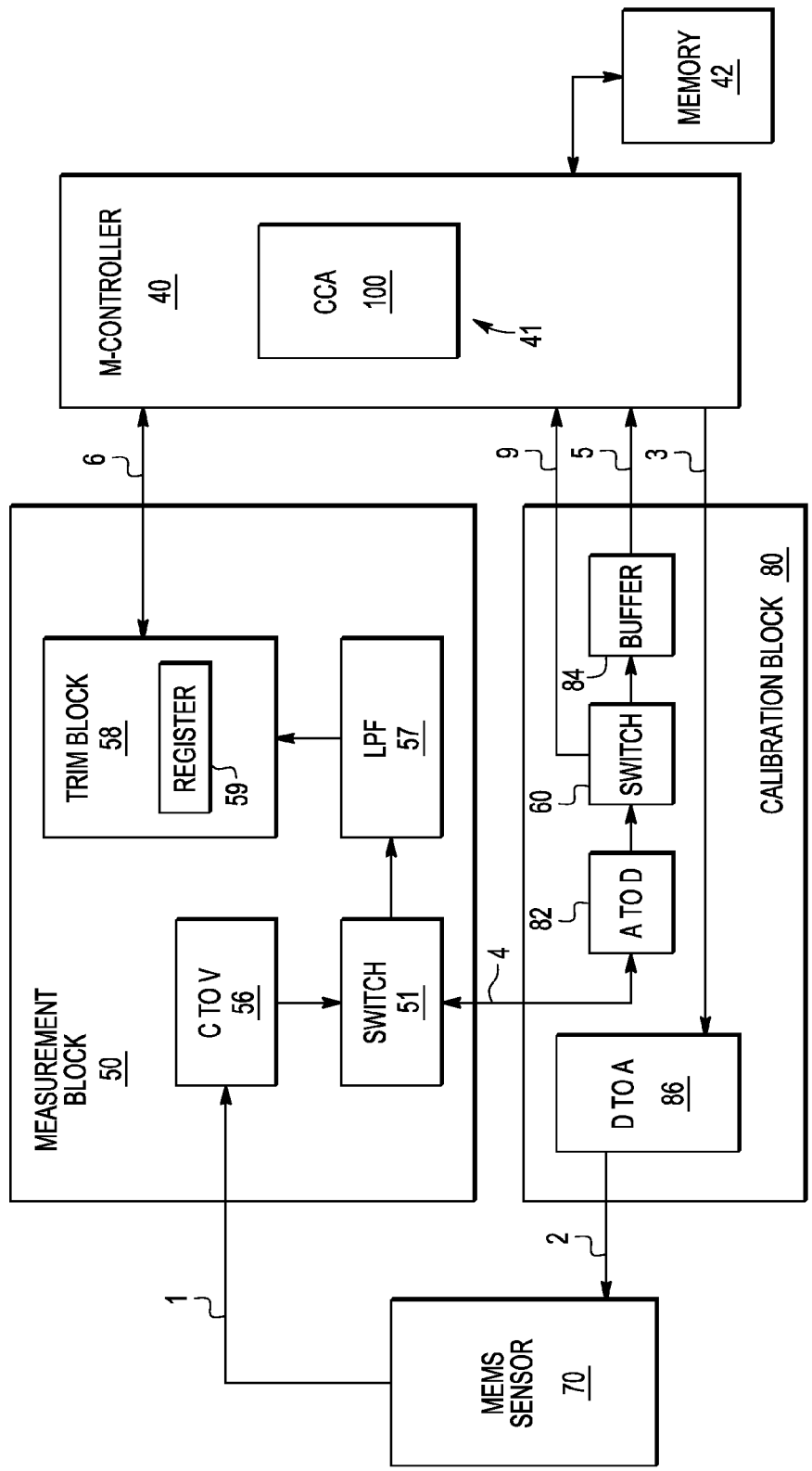
FIG. 4 shows a block diagram of a the sensor-responsive system of FIG. 1 configured in accordance with the teaching of an alternative embodiment.

FIG. 4 shows a block diagram of a sensor system 30 of the sensor-responsive system of FIG. 1 configured in accordance with an alternative embodiment. The embodiment generally illustrated in FIG. 4 includes elements similar to the embodiment generally illustrated in FIG. 2, with the addition of a switch 60. As in the embodiment generally illustrated in FIG. 2, when switch 51 is in the appropriate position, A-to-D 82 is configured to receive a voltage signal 4 from C-to-V 56 of measurement block 50, convert the received analog voltage signal to a digital signal representative of the analog voltage signal, and provide the digital voltage signal as a digital voltage signal output from A-to-D 82. However, in the embodiment generally illustrated in FIG. 4, A-to-D 82, rather than being electrically coupled to a buffer 84 (as in the embodiment of FIG. 2), is electrically coupled to switch 60, such that the digital voltage output from A-to-D 82 is provided to switch 60. Switch 60 is in turn configured to provide the digital voltage output from A-to-D 82 as an output to either buffer 84 or microcontroller 40, depending on the position of switch 60. When sensor system 30 is configured to operate in a "non-real-time" mode, switch 60 is configured to provide the digital voltage output from A-to-D 82 as an output to buffer 84. In "non-real-time" mode, the embodiment of FIG. 4 operates similarly to the embodiment of FIG. 2. As with the embodiment in FIG. 2, buffer 84 is configured to store the digital voltage signal provided by A-to-D 82, and to provide the digital voltage signal to microcontroller 40 as signal 5 such that microcontroller 40 may use the signal 5 at some point in time to monitor the operation of MEMS sensor 70 and perform various algorithms utilizing the digital voltage signal. It should be appreciated that depending on the length of time during which MEMS sensor 70 responses to various stimulus signals is being monitored and data being stored in buffer 84, and the amount of time between data storage in the buffer 84 and retrieval from buffer 84 of the data for processing, a significant amount of data could accumulate in buffer 84. Longer monitoring times and the greater the numbers of parameters being monitored call for larger sizes of buffer 84.

When sensor system 30 is configured to operate in a "real-time" mode, switch 60 is configured to provide the digital voltage output from A-to-D 82 as an output signal 9 to microcontroller 40, rather than providing that digital voltage output to buffer 84 for storage. In this "real-time" mode, microcontroller 40 is configured to receive the output signal 9 from A-to-D 82 via switch 60, and immediately process that data to determine parameters of MEMS sensor 70, without the need to store the data in memory or a buffer. In an embodiment in which sensor system 30 is operating in "real-time" mode, microcontroller 40 of MEMS sensor 70 is configured to implement apply a Compensation and Calibration algorithm, such as, for example, an algorithm including an active Kalman filter, to data received real-time from MEMS sensor 70 via A-to-D 82 via switch 60. More specifically, microcontroller 40 obtains the real-time data via switch 60, compares the real-time data to the expected value of that data based on a mathematical model of MEMS sensor 70 (detailing what that data should be responsive to the stimulus signal being applied to MEMS sensor 70), and determines if the difference between the actual data and the expected data (referred to as the "error") is less than a pre-determined threshold value. In an embodiment, the predetermined threshold value is a function of a sensitivity specification of the MEMS sensor 70. When the difference (error) is less than the pre-determined threshold value, the response is said to have "converged" to the expected value. If the difference has not converged, microcontroller 40 is configured to adjust at least one coefficient that is applied to determine the input stimulus signal (to modify the signal characteristics), and continue to monitor the data (from A-to-D 82 via switch 60) to check for convergence. Microcontroller 40 will continue this iterative process using the real-time data until either convergence occurs, or until a pre-determined period of time passes with no convergence. In an embodiment, the pre-determined period of time is a function of the sensitivity of the MEMS sensor 70 and/or the application in which the MEMS sensor 70 is being used. If a pre-determined period of time passes with no convergence, microcontroller 40 is configured to recognize this as an indicator of an error or malfunction condition in MEMS sensor 70, and communicate that error or malfunction condition to other devices in sensor system 30 or in communication with sensor system 30. If convergence does occur prior to the expiration of the predetermined time period, microcontroller 40 is configured to store updated trim values (coefficients) in trim block 58. Those updated trim values will be used by sensor system 30 to determine various parameters of MEMS sensor 70 (and as described with respect to the embodiment in FIG. 2) unless and until the calibration algorithm runs again.

It should be appreciated that other than circuitry and operation of switching between real-time and non-real-time modes as described above, and other than the operation when in real-time mode as described above, the embodiment of FIG. 4 operates similarly to the embodiment of FIG. 2.

Figure 5:
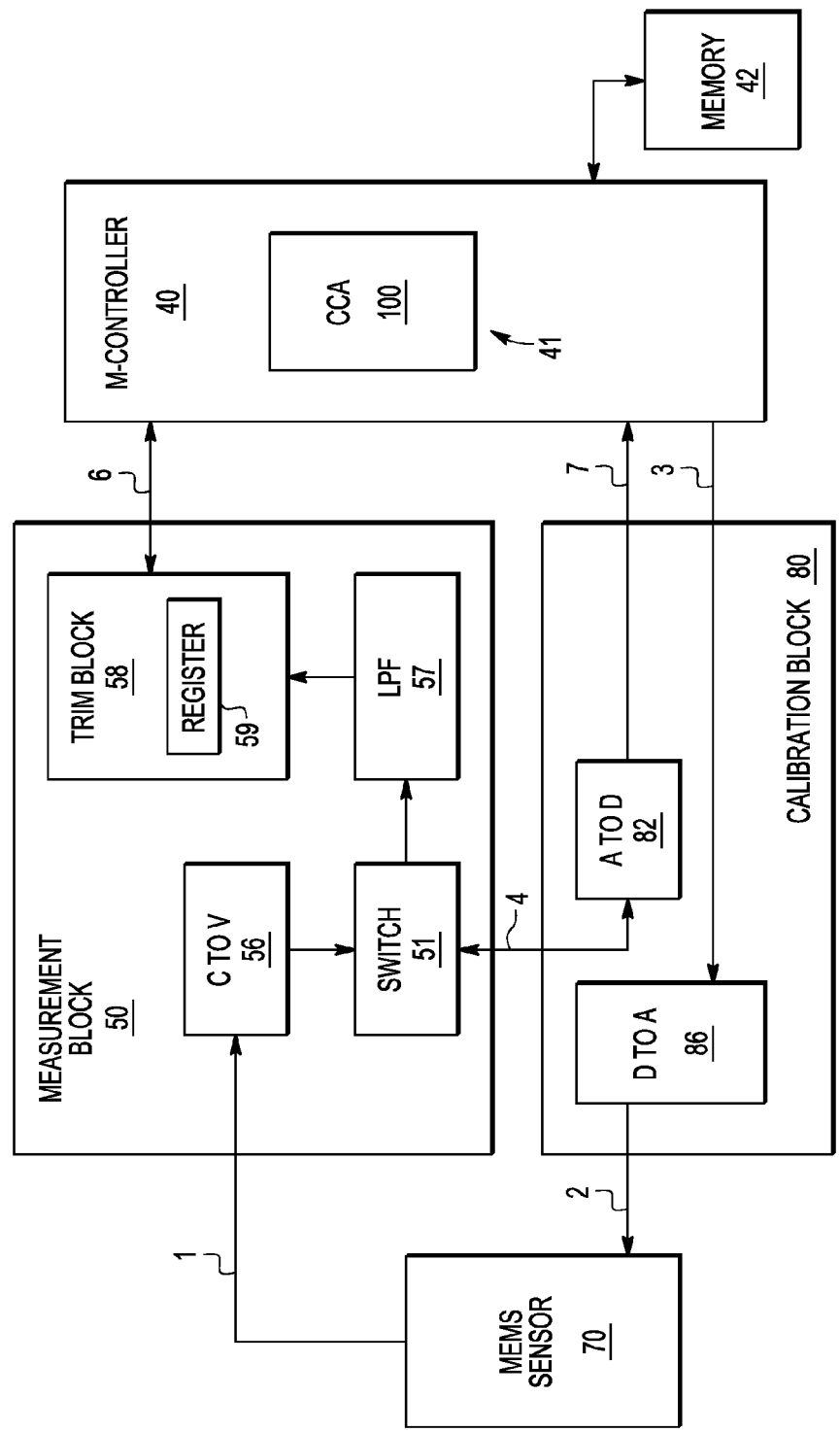
FIG. 5 shows a block diagram of a sensor system of the sensor-responsive system of FIG. 1 configured in accordance with the teaching of an alternative embodiment.

FIG. 5 shows a block diagram of a sensor system 30 of the sensor-responsive system of FIG. 1 configured in accordance with another alternative embodiment. The embodiment generally illustrated in FIG. 5 is similar to the embodiment of FIG. 4, with the exception that in this embodiment, sensor system 30 is configured to operate only in real-time mode, and not switch between real-time and non-real-time modes. Consequently, both switch 60 and buffer 84 are not present in this embodiment, and the output signal of A-to-D 82 (shown as signal 7) is provided directly to microcontroller 40. As discussed above with respect to the embodiment of FIG. 4, microcontroller 40 applies a compensation and calibration algorithm, such as, for example, an active Kalman filter, to signal 7, comparing it with data associated with a mathematical model of MEMS sensor 70 to check for convergence. If convergence occurs within a pre-determined period of time, updated trim values are stored in trim block 58. If convergence does not occur, an error condition is flagged and other elements of sensor system 30 and/or in communication with sensor system 30 are notified of the error condition.

Figure 6:
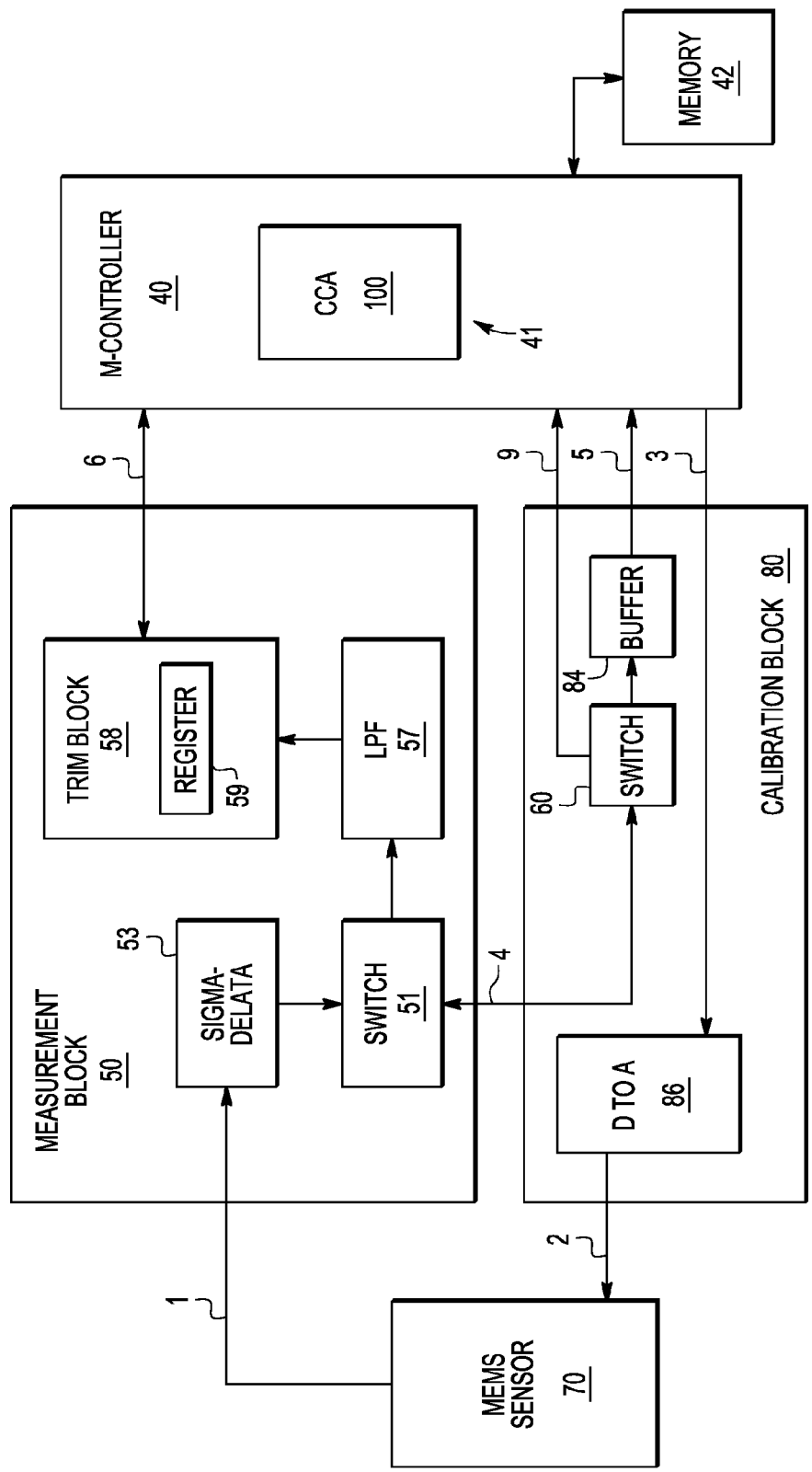
FIG. 6 shows a block diagram of a sensor-responsive system of FIG. 1 configured in accordance with the teaching of an alternative embodiment.

FIG. 6 shows a block diagram of a sensor system 30 of the sensor-responsive system of FIG. 1 configured in accordance with another alternative embodiment. The embodiment generally illustrated in FIG. 6 is similar to the embodiment of FIG. 4, with the exception that in this embodiment, C-to-V 56 has been replaced with sigma-delta modulator 53, and A-to-D 82 has been omitted. Sigma-delta modulator 53 is configured to receive an analog input signal from MEMS sensor 70 (signal 1) reflective of the motion of MEMS sensor 70, and convert it to a digital output signal representative of the analog input signal. The digital signal is then provided to switch 51, which functions to switch between providing the digital output signal of sigma-delta modulator 53 to switch 60 (A-to-D 82 no longer being necessary because the digital output signal of sigma-delta modulator 53 is already in digital form), and providing the digital output signal of sigma-delta modulator 53 to low pass filter 57. Aside from these changes (replacing A-to-D 82 with sigma-delta modulator 53 and omitting A-to-D 82), the embodiment of FIG. 6 functions similarly to the embodiment generally described in FIG. 4.

Figure 7:
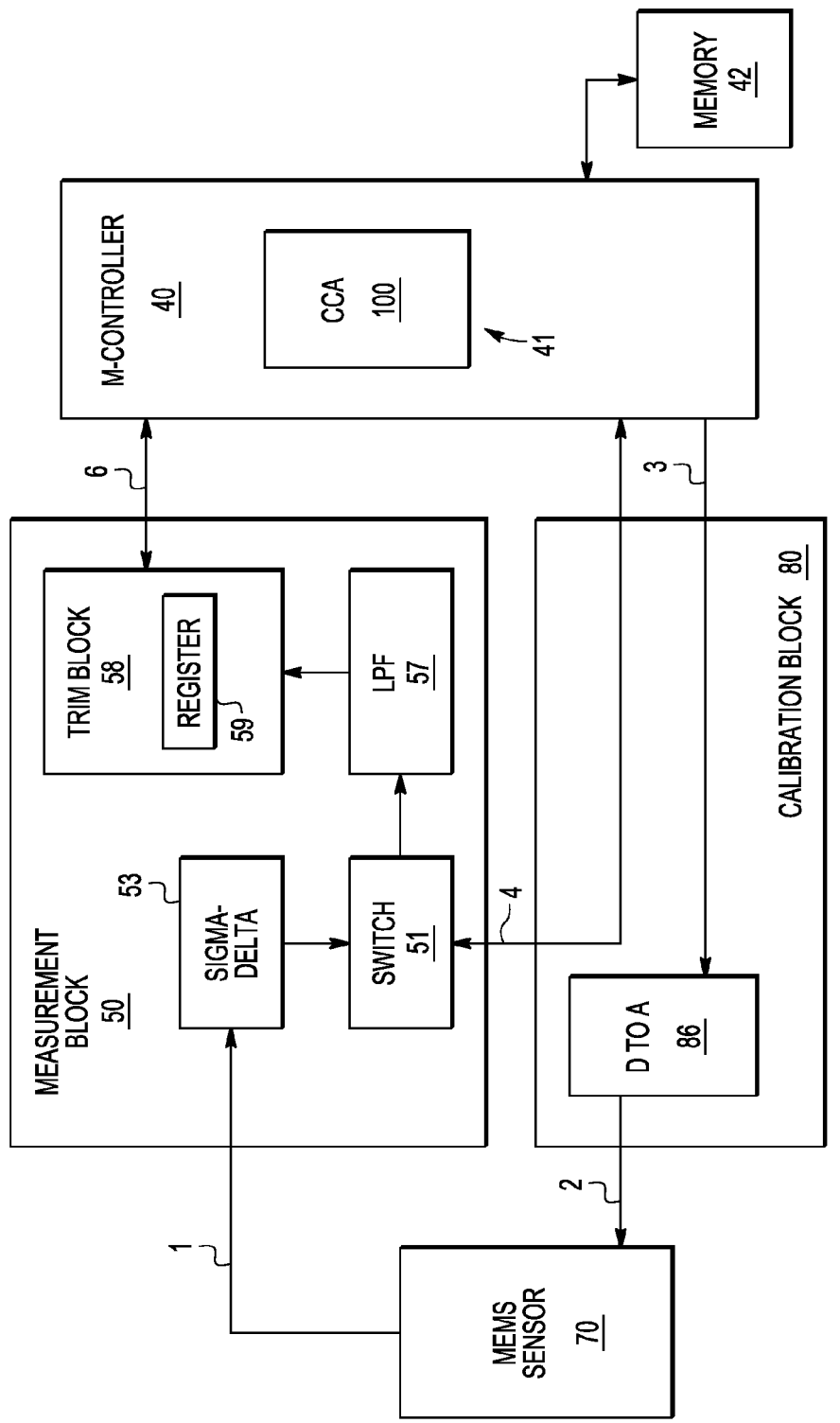
FIG. 7 shows a block diagram of a sensor system of the sensor-responsive system of FIG. 1 configured in accordance with the teaching of an alternative embodiment.

FIG. 7 shows a block diagram of a sensor system 30 of the sensor-responsive system of FIG. 1 configured in accordance with another alternative embodiment. The embodiment generally illustrated in FIG. 7 is similar to the embodiment of FIG. 6, with the exception that in this embodiment, sensor system 30 is configured to operate only in real-time mode, and not switch between real-time and non-real-time modes. Consequently, both switch 60 and buffer 84 are not present in this embodiment, and the output signal of switch 51 (shown as signal 4), which is the digital output signal provided by sigma-delta modulator 53, is provided directly to microcontroller 40. As discussed above with respect to the embodiment of FIG. 4, microcontroller 40 applies a compensation and calibration algorithm, such as, for example, and active Kalman filter, to signal 4, comparing it with data associated with a mathematical model of MEMS sensor 70 to check for convergence. If convergence occurs within a pre-determined period of time, updated trim values are stored in trim block 58. If convergence does not occur, an error condition is flagged and other elements of sensor system 30 and/or in communication with sensor system 30 are notified of the error condition.

Figure 8:
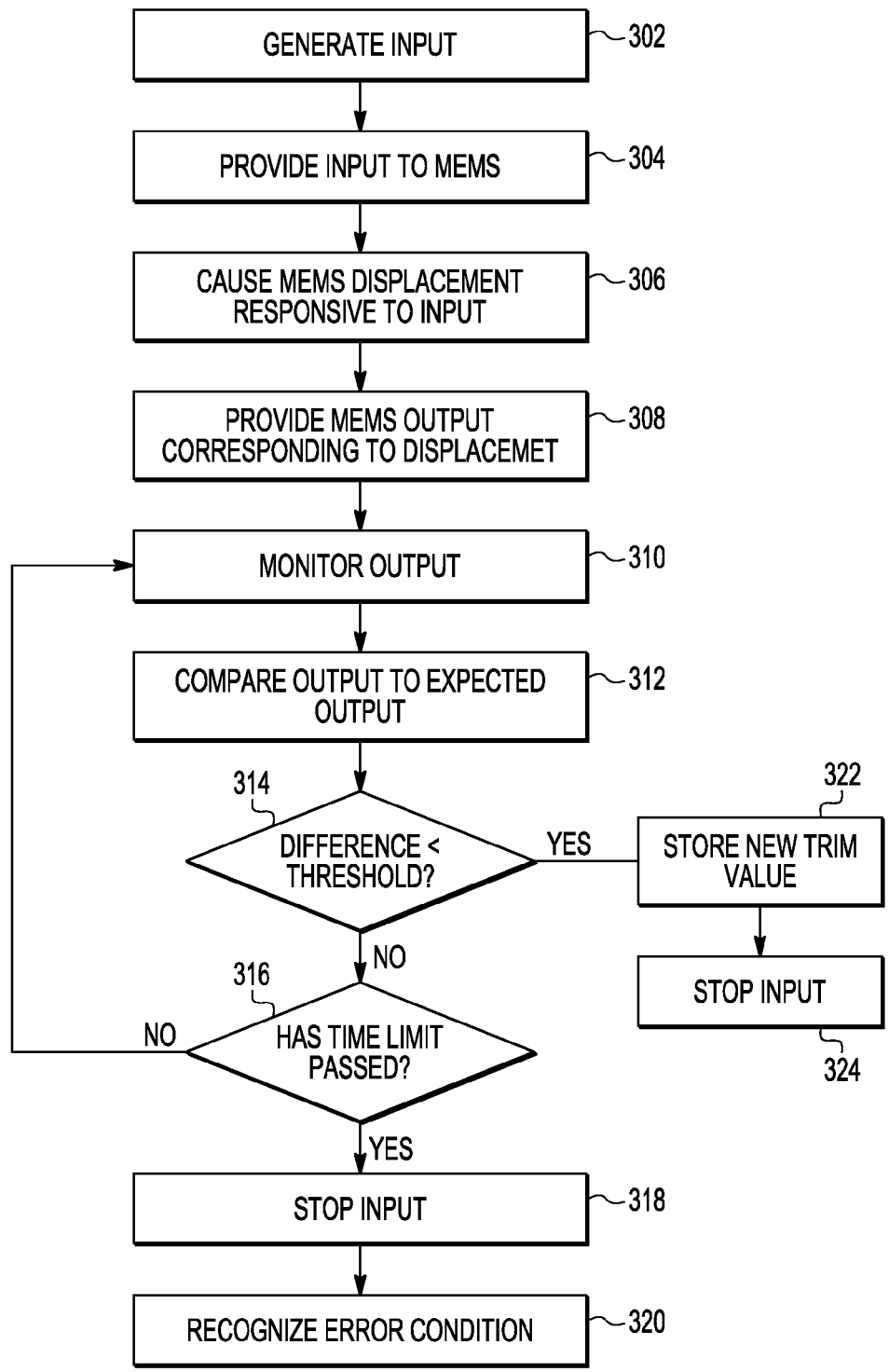
FIG. 8 shows a flow chart of a sensor monitoring and calibration method, according to an embodiment.

FIG. 8 shows a flow chart of a sensor monitoring and calibration method 300, according to an embodiment. In an embodiment, the method 300 is implemented by the execution of Calibration and Compensation Algorithm 100. In a first operation 302, an input signal 3 is generated by a microcontroller 40 (FIG. 1). The signal may be a single value, such as a single voltage level, or it may be a signal pattern including multiple values over time. In a second operation 304, the input signal is provided by microcontroller 40 to a MEMS sensor 70 (FIG. 1) as a signal 2. In a third operation 306, a physical displacement is caused in the MEMS sensor 70 responsive to the input signal 2. In a fourth operation 308, an output signal 1 is provided from the MEMS sensor 70 corresponding to the physical displacement in the MEMS sensor 70 responsive to the input signal 2. In a fifth operation 310, the output is monitored external to the MEMS sensor 70 in microcontroller 40. In a sixth operation 312, microcontroller 40 compares the output from MEMS sensor 70 responsive to the input signal 2 with the expected output of MEMS sensor 70 responsive to the input signal 2.

In a seventh operation 314, microcontroller 40 makes a determination, based on the results of the comparison of operation 312, as to whether or not the difference between the expected output and the actual output of MEMS sensor 70 is less than a pre-determined threshold. If the difference is less than a pre-determined threshold, the new trim values are stored in sensor system 30 in operation 322, and the input ceases to be provided to MEMS sensor 70 in operation 324. If the difference is not less than a pre-determined threshold, processing continues with an eighth operation 316. In eighth operation 316, microcontroller 40 makes a determination as to whether or not a pre-defined time limit has passed. If the pre-defined time limit has not passed, processing returns to operation 310. In the pre-defined time limit has passed, processing continues with a ninth operation 318, in which the input ceases to be provided to MEMS sensor 70. In a tenth operation 320, an error condition is recognized in sensor system 30 and communicated.

Figure 9:
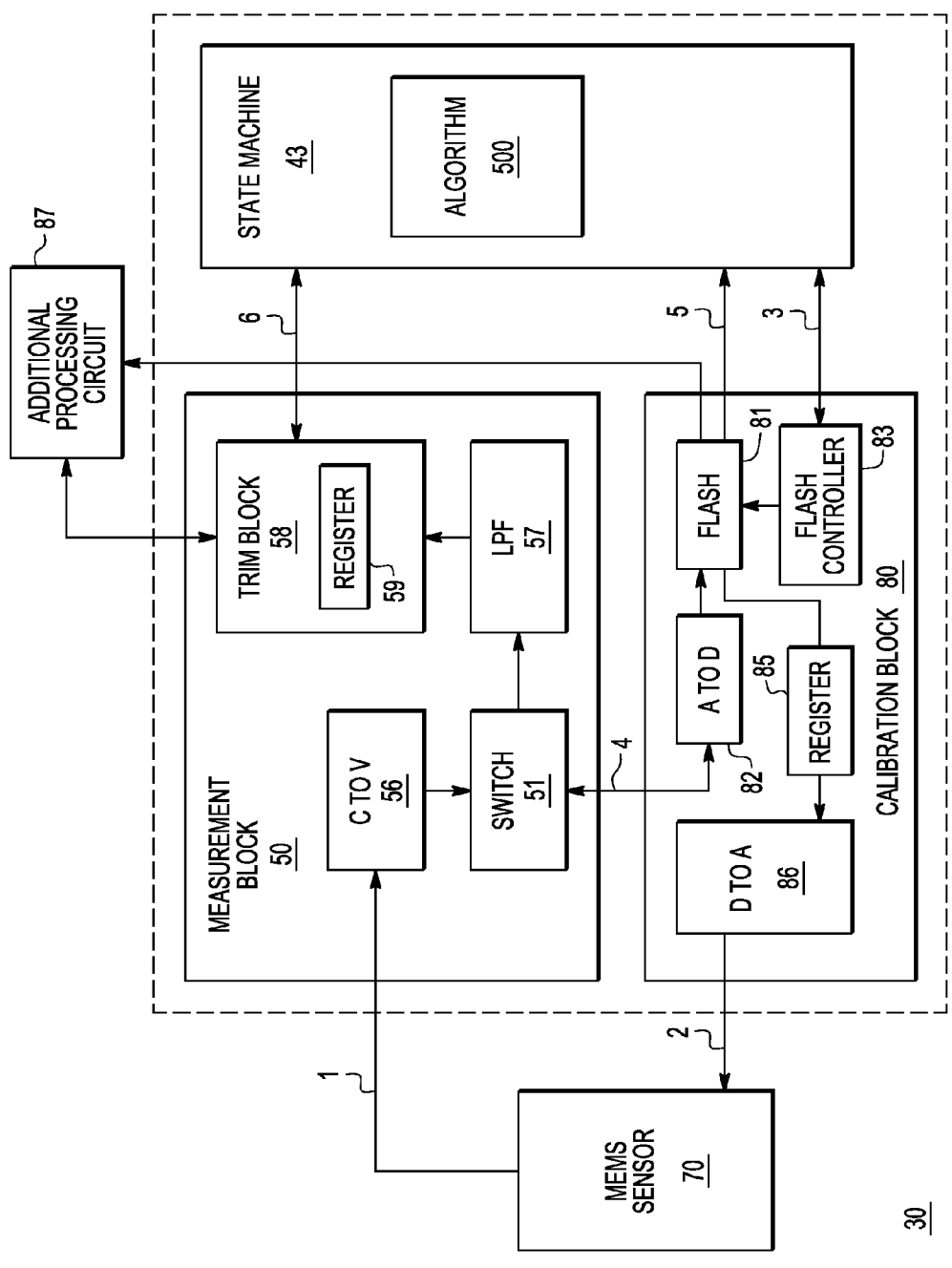
FIG. 9 shows a block diagram of a sensor system of the sensor-responsive sys em of FIG. 2 configured in accordance with the teaching of an alternative embodiment; and, FIG. 10 shows a flow chart of a sensor monitoring and calibration method, according to an embodiment.

FIG. 9 shows a block diagram of a sensor system 30 of the sensor-responsive system of FIG. 2 configured in accordance with an alternative embodiment. The embodiment generally illustrated in FIG. 9 includes the same elements as the embodiment generally illustrated in FIG. 2, with the following exceptions: microcontroller 40 has been replaced by control circuitry 43, buffer 84 has been replaced by flash memory 81, memory 42 has been removed, and register 85, flash memory controller 83 and additional processing circuitry 87 have been added. Although in the embodiment generally illustrated in FIG. 9, control circuitry 43 is a state machine 43, it should be appreciated that in alternative embodiments, control circuitry 43 may be circuitry, logic, or a microcontroller or processor. MEMS sensor 70, and the elements generally illustrated in measurement block 50 of sensor system 30 are similar to those generally illustrated in FIG. 2 and operate as described above with reference to FIG. 2. However, rather than being electrically coupled to a processor (microcontroller 40) as in the embodiment of FIG. 2, trim block 58 is electrically coupled to state machine 43. State machine 43 is generally illustrated being configured to perform a compensation and calibration algorithm 500, which will be described in further detail below, and to communicate with trim block 58, flash memory controller 83, and additional processing circuitry 87. Because it is electrically coupled to trim block 58, state machine 43 may be configured to write trim values to trim block 58, including to register 59 of trim block 58, and may also be configured to read trim values from trim block 58, including from register 59 of trim block 58. In the embodiment generally illustrated in FIG. 9, state machine 43 is configured to communicate information to and/or from other devices of sensor system 30, and to control the operation of other devices of sensor system 30, when sensor system 30 is operating in a calibration mode. Furthermore, unlike the embodiment of FIG. 2, trim block 58 is further shown being electrically coupled to additional processing circuitry 87. Additional processing circuitry 87 may be configured to read data, including trim values, from trim block 58, including register 59 of trim block 58. Although in the embodiment of FIG. 9, 43 is shown as a state machine, it should be appreciated that in alternative embodiments, 43 may be logic or other circuitry. In an alternative embodiment, 43 is logic circuitry in electrical communication with calibration block 80, and is configured to communicate with calibration block 80 to cause calibration block 80 and elements therein to provide stimulus signals to MEMS sensor 70.

Additional processing circuitry 87 may also be configured to write data, including trim values, to trim block 58, including register 59 of trim block 58. In an embodiment, additional processing circuitry 87 may be test equipment to which the remaining elements of sensor system 30 may be temporarily coupled to allow the evaluation of trim values of sensor system 30 and the updating of those values. In an alternative embodiment, additional processing circuitry 87 may be permanently coupled to the remaining elements of sensor system 30 to allow sensor system 30 to be used in an application, such as, for example, an air bag application. It should be appreciated that sensor system 30 could be initially temporarily coupled to additional processing circuitry 87 that is test equipment, to allow the determination of trim values for sensor system 30, and subsequently permanently electrically coupled to additional processing circuitry 87 that is application circuitry to allow sensor system 30 to operate in an application.

The elements generally illustrated in calibration block 80 of sensor system 3 that are the same as those generally illustrated in FIG. 2 (A-to-D 82 and D-to-A 86) operate as described above with reference to FIG. 2. However, rather providing its output to a buffer 84 as in the embodiment in FIG. 2, A-to-D 82 is electrically coupled to, and provides its output to, memory 81. In once embodiment, memory 81 is flash memory. In alternative embodiments, memory 81 may be any other volatile or non-volatile memory capable of storing data. Memory 81 electrically coupled to state machine 43, memory controller 83, and register 85. Memory 81 is configured to store data provided to it by A-to-D 82, and stimulus signal pattern data to be provided to MEMS sensor 70 via register 85 and D-to-A 86. Memory controller 83 is electrically coupled to state machine 43, and is configured to, responsive to control signals provided by state machine 43, cause stimulus signal pattern data to be provided from memory 81 to register 85. Register 85 is electrically coupled to D-to-A 86, and is configured to provide its digital stimulus signal pattern data to D-to-A 86. As in the embodiment generally illustrated in FIG. 2, D-to-A 86 is configured to convert the received digital stimulus signal pattern data into an analog signal, and provide the resulting analog stimulus signal to MEMs sensor 70. When electrically coupled to additional processing circuitry 87, memory 81 is also configured to provide data, including data stored in memory 81 received from A-to-D 82, to additional processing circuitry 87 for reading and/or processing by the additional processing circuitry 87. When electrically coupled to additional processing circuitry 87, memory 81 may also be configured to store data provided to it by additional processing circuitry 87, including stimulus signal patterns. As shown, memory 81 is also electrically coupled to state machine 43, and may be configured to provide stored data to state machine 43, or store data received from state machine 43.

In terms of operation, it should be appreciated that the embodiment generally illustrated in FIG. 9 is configured to operate in one of two modes. The first mode is a calibration mode, in which trim values for MEMs sensor 70 are being determined. The second mode is an application mode in which trim values for MEMs sensor 70 are not being determined, and sensor system 30 is operating in an application, such as, for example airbag application.

Referring to FIG. 9, the operation of sensor system 30 according to an embodiment of the invention in which sensor system 30 is operating in a calibration mode is being performed is generally described. Prior to entering the calibration mode, at least one digital stimulus signal pattern has been stored in memory 81. Responsive to Calibration and Compensation Algorithm 500, which state machine 43 is configured to implement, state machine 43 causes memory controller 83 to cause memory 81 to begin providing the digital stimulus signal pattern to register 85, and to continue providing the digital stimulus signal pattern to register 85 for a predetermined period of time. Register 85 is in turn configured to provide the digital stimulus signal pattern to D-to-A 86 of calibration block 80. In an embodiment, the digital signal is a pseudorandom signal. In alternative embodiments, the digital signal may be a square wave, a two-tone pattern, multi-tone signal or other signal pattern. D-to-A 86 converts the digital signal into an analog signal, and provides it as an analog input signal 2 to an input of MEMS sensor 70. The analog input signal 2 creates an electromagnetic force that pulls the moveable mechanical portion (for example, a metallic plate) up and/or down, thereby causing the moveable mechanical portion of MEMS sensor 70 to move responsive to the analog signal. In an embodiment, the analog input signal 2 is applied to fixed capacitance plates of the MEMS sensor 70 located near a moveable mechanical portion, causing the moveable mechanical portion to move.

The movement of the moveable mechanical portion of MEMS sensor 70 causes a capacitance value provided at an output of MEMS sensor 70 to vary in a manner that corresponds to the magnitude of the movement of the moveable mechanical portion of MEMS sensor 70. C-to-V 56 of measurement block 50 receives the signal 1 indicative of the varying capacitance value and converts the capacitance values into voltage values. Responsive to Calibration and Compensation Algorithm 500, implemented by state machine 43, state machine 43 causes switch 51 to switch to a position such that the voltage values provided by C-to-V 56 are provided as an input signal 4 to A-to-D 82 of calibration block 80, A-to-D 82 of calibration block 80 converts the voltage values into digital values, and provides the resulting values to memory 81, where the values are stored for later retrieval. It should be appreciated that the digital values may be stored in memory 81 until sensor system 30 is caused to cease operating in calibration mode by state machine 43. When sensor system 30 ceases to operate in calibration mode, memory 81 will contain a number of data values indicative of MEMS sensor 70's response to the digital stimulus signal pattern. Later, when the values are read by processing circuitry, such as, for example, additional processing circuitry 87, which may be a tester, the processing circuitry may compare the resulting stored digital values indicative of MEMS sensor 70's response to the initial digital stimulus signal pattern, and calculate appropriate trim and compensation values for MEMs sensor 70. These trim and/or compensation values may then be written to trim block 58 by additional processing circuitry 87 for use when sensor system 30 is operating in an application mode. It should be appreciated that the external processing circuitry, by using the values stored in memory 81, may determine any of the parameters and/or characteristics generally described with respect to the embodiment of FIG. 2, using the same methods as the embodiment of FIG. 2, but with the determination and calculation being performed external to sensor system 30 rather than by a processing circuit in sensor system 30 itself.

Continuing to refer to FIG. 9, the operation of sensor system 30, according to an embodiment of the invention in which calibration is not being performed (application mode), is generally described. State machine 43 provides a signal to switch 51 to switch to a position in which C-to-V 56 provides its output voltage signal 4 to a low pass filter 57. It should be appreciated that when calibration is not being performed, the movable mechanical portions of MEMS sensor 70 will be moving responsive to physical forces (stimulus) to which the sensor system 30 is being subjected. In this case, the capacitive output of MEMS sensor 70 will correspond to the motion of the moveable mechanical portions of MEMS sensor 70 responsive to the physical stimulus. C-to-V 56 of measurement block 50 receives this capacitive output of MEMS sensor 70, converts it to a voltage, and provides the voltage signal 4 to low pass fitter 57. Low pass filter 57 filters the voltage signal to remove noise, and provides the filtered voltage to trim block 58. Trim block 58 in turn adjusts the voltage signal based on trim values stored in register 59 or trim block 58, and provides the filtered voltage to state machine 43 as signal 6, and to additional processing circuitry 87. Additional processing circuitry 87 uses the trimmed voltage signal to perform various tasks and/or functions based on the values of the voltage signal, and dependent upon the application in which sensor system 30 is operating. Additional processing circuitry 87 evaluates the trimmed, filtered voltage signal, and determines, based on the adjusted, filtered voltage signal, how much the moveable mechanical portion of MEMS sensor 70 has moved. If the moveable mechanical portion of MEMS sensor 70 has moved beyond a predetermined amount, or has moved in a predetermined pattern, additional processing circuitry 87 is configured to cause some action to be taken. For example, if sensor system 30 is operating in an airbag system, additional processing circuitry 87 may be configured to evaluate the voltage signal to determine if the airbag has deployed.

Figure 10:
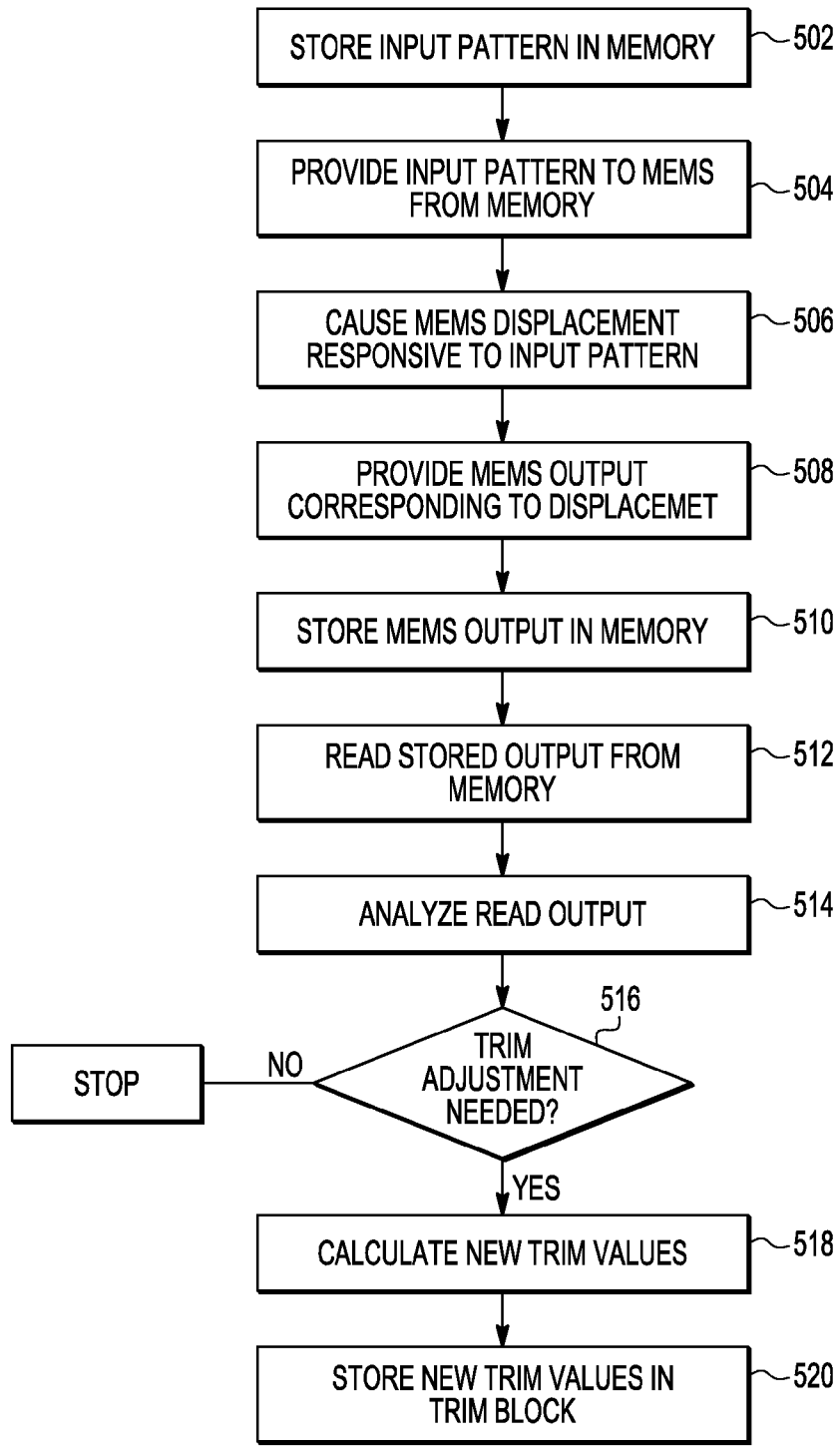

FIG. 10 shows a flow chart of a sensor monitoring and calibration method 500, according to an embodiment. In a first operation 502, an input signal pattern is stored in memory. The signal is a signal pattern including multiple values. In a second operation 504, the input signal pattern is provided from memory to a MEMS sensor 70 in the form of a signal. In a third operation 506, a physical displacement is caused in the MEMS sensor 70 responsive to the input signal pattern. In a fourth operation 508, an output signal is provided from the MEMS sensor 70 corresponding to the physical displacement in the MEMS sensor 70 responsive to the input signal pattern. In a fifth operation 510, the output is stored in memory. In a sixth operation 512, the stored output is read from memory.

In a seventh operation 514, the read output is analyzed to compare the output from MEMS sensor 70 responsive to the input signal pattern with the expected output of MEMS sensor 70 responsive to the input signal pattern. In an eighth operation 516, a determination is made as to whether or not an adjustment of a trim value associated with MEMS sensor 70 is needed. If a trim adjustment is not needed, the method ends. If a trim adjustment is needed, processing continues with a ninth operation 318. In ninth operation 518, new trim values associated with MEMs sensor 70 are calculated. In a tenth operation 520, the calculated new trim values are stored.

Embodiments described herein provide for the electrical testing of MEMS devices without a need for applying physical forces external to the MEMS device. Systems and methods are provided for testing, monitoring and recalibrating MEMS devices throughout the lifetime of those MEMS devices, even on a continuous basis, while those devices remain located and functioning in systems employing the MEMS devices. Systems and methods are also provided for testing and recalibrating MEMS devices in real-time, without the need to store intermediate data used to calibrate the MEMS devices in memory. Finally, systems and methods are also provided for testing and recalibrating MEMS devices utilizing state machines or other simple circuitry or logig, rather than processors or microcontrollers. Thus, systems and methods achieving design objectives of tow-cost MEMS sensor testing, repeated testing of MEMS sensors throughout the life of the MEMS sensors, testing of MEMS sensors without removal of the sensors from the application, and re-calibration of MEMS devices during the life of the MEMS devices are provided. The systems and methods further allow for reduced testing costs, real-time calibration, and improved reliability of the system utilizing the MEMS devices.

Although the preferred embodiments of the invention have been illustrated and described in detail, it will be readily apparent to those skilled in the art that various modifications may be made therein without departing from the spirit of the invention or from the scope of the appended claims.

The invention claimed is:

1. A method of monitoring and calibrating MEMS sensors in a system comprising a MEMS sensor, comprising:
generating an electronic stimulus signal in the system;
providing the electronic stimulus signal to the MEMS sensor;
providing an electronic output from the MEMS sensor corresponding to a physical displacement of a portion of the MEMS sensor responsive to the electronic stimulus signal;
monitoring, the electronic output from the MEMS sensor;
determining a characteristic of the MEMS sensor based on the electronic output;
comparing the monitored electronic output to an expected output to determine if the difference between the monitored output and expected output is less than a pre-determined threshold;
calculating a new trim value for the MEMS sensor when the difference is less than the pre-determined threshold.

2. A method as claimed in claim 1, further including the step of storing the new trim value for the MEMS sensor in the system.

3. A method of monitoring and calibrating MEMS sensors in a system comprising a MEMS sensor, comprising:
generating an electronic stimulus signal in the system;
providing the electronic stimulus signal to the MEMS sensor;
providing an electronic output from the MEMS sensor corresponding to a physical displacement of a portion of the MEMS sensor responsive to the electronic stimulus signal;
monitoring, the electronic output from the MEMS sensor;
determining a characteristic of the MEMS sensor based on the electronic output;
comparing the monitored electronic output to an expected output to determine if the difference between the monitored output and expected output is less than a pre-determined threshold;
monitoring in the processor the amount of elapsed time that has passed without the difference falling below the pre-determined threshold; and,
recognizing an error condition if the elapsed time reaches a pre-determined time limit.

4. A method as claimed in claim 3, further including the step of calculating a new trim value for the MEMS sensor when the difference is less than the pre-determined threshold.

5. A method as claimed in claim 3, further including the step of disabling the system if an error condition is recognized.

6. A method as claimed in claim 3, further including calculating a trim value for the MEMS sensor based on the determined characteristic.

7. A method of monitoring and calibrating MEMS sensors in a system comprising a MEMS sensor, comprising:
generating an electronic stimulus signal;
providing the generated electronic stimulus signal to a MEMS sensor of the system to cause a physical displacement of a portion of the MEMs sensor;
providing an output signal from the MEMS sensor corresponding to the physical displacement;
monitoring, in the system, the output signal;
analyzing the output signal to determine a characteristic of the MEMS sensor;
disabling a function of the system based on the determined characteristic.

8. A method as claimed in claim 7, wherein the step of analyzing the output signal further includes the step of comparing the output signal to an expected output of a MEMS sensor responsive to the generated electronic stimulus signal to determine a difference between the output signal and expected output.

9. A method of monitoring and calibrating MEMS sensors in a system comprising a MEMS sensor, comprising:
generating an electronic stimulus signal;
providing the generated electronic stimulus signal to a MEMS sensor of the system to cause a physical displacement of a portion of the MEMs sensor;
providing an output signal from the MEMS sensor corresponding to the physical displacement;
monitoring, in the system, the output signal;
analyzing the output signal to determine a characteristic of the MEMS sensor, wherein the step of analyzing the output signal further includes the step of comparing the output signal to an expected output of a MEMS sensor responsive to the generated electronic stimulus signal to determine a difference between the output signal and expected output;
determining if a new trim value is needed based on at least one of the determined characteristic and determined difference.

10. A method as claimed in claim 9, further including the step of disabling a function of the system based on the determined characteristic.

11. A method as claimed in claim 9, further including the step of determining the new trim value based on at least one of the determined characteristic and determined difference.

12. A method as claimed in claim 11, further including the step of storing the new trim value in the system.

13. A method of monitoring and calibrating MEMS sensors in a system comprising a MEMS sensor and a processor, comprising:
generating a stimulus signal in a processor;
providing the stimulus signal to a MEMS sensor in electrical communication with the processor, wherein the MEMS sensor includes a portion that displaces responsive to the stimulus signal test pattern;
providing an indicator electronic output from the MEMS sensor corresponding to the displacement to the processor;
monitoring, as it is provided, the indicator electronic output from the MEMS sensor in the processor;
comparing, as it is provided, the value of the monitored electronic output to an expected output to determine if the difference between the monitored output and expected output is less than a pre-determined threshold;
storing the stimulus signal in memory of the system.

14. A method of monitoring and calibrating MEMS sensors in a system comprising a MEMS sensor and a processor, comprising:
generating a stimulus signal in a processor;
providing the stimulus signal to a MEMS sensor in electrical communication with the processor, wherein the MEMS sensor includes a portion that displaces responsive to the stimulus signal test pattern;
providing an indicator electronic output from the MEMS sensor corresponding to the displacement to the processor;
monitoring, as it is provided, the indicator electronic output from the MEMS sensor in the processor;
comparing, as it is provided, the value of the monitored electronic output to an expected output to determine if the difference between the monitored output and expected output is less than a pre-determined threshold;
monitoring in the processor the amount of elapsed time that has passed without the difference falling below the pre-determined threshold; and,
recognizing an error condition if the elapsed time reaches a pre-determined time limit.

15. A method as claimed in claim 14, further including the step of disabling the system if an error condition is recognized.

16. A method as claimed in claim 14, further including the step storing the stimulus signal in memory of the system.

17. A method of monitoring and calibrating MEMS sensors in a system comprising a MEMS sensor and a processor, comprising:
generating a stimulus signal in a processor;
providing the stimulus signal to a MEMS sensor in electrical communication with the processor, wherein the MEMS sensor includes a portion that displaces responsive to the stimulus signal test pattern;
providing an indicator electronic output from the MEMS sensor corresponding to the displacement to the processor;

monitoring, as it is provided, the indicator electronic output from the MEMS sensor in the processor;

comparing, as it is provided, the value of the monitored electronic output to an expected output to determine if the difference between the monitored output and expected output is less than a pre-determined threshold;

calculating a new trim value for the MEMS sensor when the difference is less than the pre-determined threshold.

18. A method as claimed in claim 17, further including the step of storing the new trim value for the MEMS sensor in the system.

19. A method as claimed in claim 17, further including the step storing the stimulus signal in memory of the system.

\* \* \* \* \*